United States Patent [19]

Duffy et al.

[11] Patent Number: 4,775,641
[45] Date of Patent: Oct. 4, 1988

[54] METHOD OF MAKING SILICON-ON-SAPPHIRE SEMICONDUCTOR DEVICES

[75] Inventors: Michael T. Duffy, West Windsor; Glenn W. Cullen, Princeton, both of N.J.

[73] Assignee: General Electric Company, Schenectady, N.Y.

[21] Appl. No.: 911,423

[22] Filed: Sep. 25, 1986

[51] Int. Cl.$^4$ ............................................. H01L 21/423
[52] U.S. Cl. ...................................... 437/21; 437/84; 437/174; 437/939; 437/973
[58] Field of Search ................. 437/84, 21, 938, 939, 437/973, 174

[56] References Cited

U.S. PATENT DOCUMENTS

| | | | |
|---|---|---|---|
| 3,393,088 | 7/1968 | Manasevit et al. | 437/84 X |
| 3,658,586 | 4/1972 | Wang | 437/84 |
| 3,885,061 | 5/1975 | Corboy et al. | 437/84 |
| 4,177,084 | 12/1979 | Lau et al. | 437/21 |
| 4,252,574 | 2/1981 | Fabula | 437/21 |
| 4,259,779 | 4/1981 | Ipri et al. | 437/21 |
| 4,279,688 | 7/1981 | Abrahams et al. | 437/84 X |
| 4,385,937 | 5/1983 | Ohmura | 437/84 X |
| 4,463,492 | 8/1984 | Maeguchi | 437/21 |
| 4,509,990 | 4/1985 | Vasudev | 437/11 |
| 4,634,473 | 1/1987 | Swartz et al. | 437/21 |
| 4,659,392 | 4/1987 | Vasudev | 437/84 X |

OTHER PUBLICATIONS

J. P. Amano et al., "Low-Defect-Density Silicon on Sapphire," Journal of Crystal Growth, vol. 56, pp. 296-303, 1982.

K. W. Carey et al., "Structural Characterization of Low-Defect-Density Silicon on Sapphire," Journal of Applied Physics, vol. 54, No. 8, pp. 4414-4420, Aug. 1983.

I. Golecki, "The Current Status of Silicon-on-Sapphire and other Heteroepitaxial Silicon-on-Insulator Technologies," Comparison of Thin Film Transistor and SOI Technologies (Materials Research Society Symposia Proceedings), vol. 33, pp. 3-23, North-Holland, N.Y.

A. Gupta et al., "Recent Advances In Hetero-Epitaxial Silicon-on-Insulator Technology," Solid State Technology, vol. 26, pp. 129-134, Jun. 1983.

S. Lau et al., "Improvement of Crystalline Quality of Epitaxial Silicon Layers by Ion Implantation Techniques," Applied Physics Letter, vol. 34, No. 1, pp. 76-78, Jan. 1979.

J. Y. Lee et al., "A Low-Leakage VLSI CMOS/SOS Process with Thin EPI Layers," 1983 IEEE International Electron Devices Meeting, Washington, D.C., Dec. 1983, Technical Digest No. 14.8, pp. 376-379.

D. C. Mayer et al., A Short-Channel CMOS/SOS Technology in Recrystallized 0.3-micron-Thick Silicon-on-Sapphire Films," IEEE Electron Device Letters, vol. EDL-5, No. 5, pp. 156-158, May, 1984.

R. Reedy et al., "Characterization of Defect Reduction and Aluminum Redistribution In Silicon Implanted SOS Films," Journal of Crystal Growth, vol. 58, pp. 53-60, 1982.

R. Reedy et al., "Suppressing Al Outdiffusion in Implantation Amorphized and Recrystallized Silicon on Sapphire Films," Applied Physics Letter, vol. 42, No. 8, pp. 707-709, Apr. 1983.

Primary Examiner—George T. Ozaki
Attorney, Agent, or Firm—Henry I. Steckler; James C. Davis, Jr.; Paul R. Webb, II

[57] ABSTRACT

A radiation hardened silicon-on-insulator semiconductor device and method of making the same is disclosed. A region is formed in the silicon layer adjacent the insulating substrate which has a high density of naturally occurring crystallographic defects. This region substantially reduces the back-channel leakage that occurs when the device is operated after being irradiated.

14 Claims, 3 Drawing Sheets

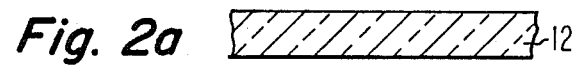
Fig. 2a
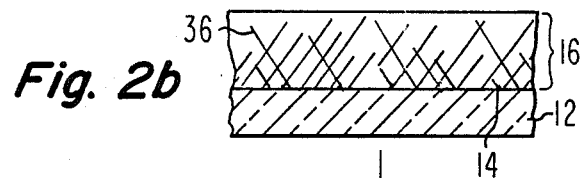
Fig. 2b
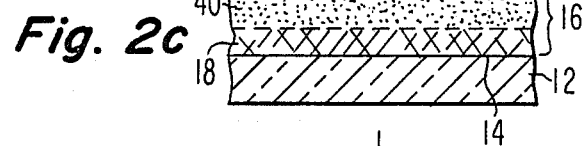
Fig. 2c
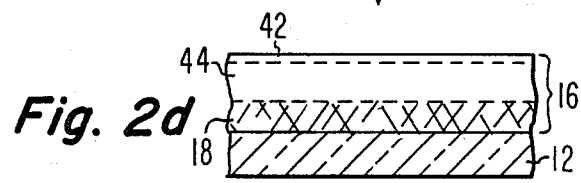
Fig. 2d
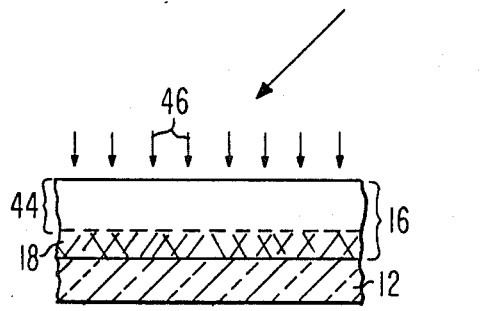
Fig. 2e
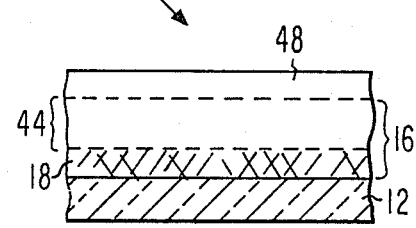
Fig. 2f
DEVICE FABRICATION
Fig. 2g

METHOD OF MAKING SILICON-ON-SAPPHIRE SEMICONDUCTOR DEVICES

The present invention relates to a radiation hardened silicon-on-insulator (SOI) semiconductor device and a method of making the same.

BACKGROUND OF THE INVENTION

Silicon-on-insulator (SOI) semiconductor devices, such as silicon-on-sapphire (SOS) transistors, are increasingly being used in very large scale integration (VLSI) circuits. However, the high defect structure of the silicon layer has been regarded as a limiting factor in exploiting the full potential of silicon-on-sapphire semiconductor devices. These defects are particularly troublesome when the silicon thickness is scaled down from 0.5 micron to 0.3 micron and less to meet the requirements of advanced VLSI circuits.

The crystallographic defects in the silicon are caused by a reaction between the sapphire substrate and the silicon film. Lattice mismatch and differences in the thermal- expansion coefficients of the silicon layer and the sapphire substrate also contribute to the formation of the crystallographic defects. Devices formed in thin silicon layers have low carrier mobility, slow operating speeds and low drain currents.

There is a continuing effort to reduce the number of crystallographic defects in the silicon layer. The silicon properties have been improved by modifying the substrate surface finish and controlling the silicon growth process. These techniques have significantly improved the silicon properties; however, it has become necessary to turn to post-deposition processes to improve the crystalline quality in order to meet the requirements associated with advanced VLSI circuits.

Solid phase epitaxy (SPE) is an example of a post-deposition process used to enhance the crystallographic and semiconducting properties of the silicon layer. In the conventional SPE process, silicon ions are implanted into the monocrystalline silicon layer to form a subsurface amorphous region extending down to the sapphire substrate. However, a small region of the original crystalline material remains at the surface of the silicon layer. The structure is then annealed at a temperature greater than about 550° C. The region of crystalline material at the surface of the silicon layer acts as a nucleation seed for the recrystallization of the amorphous region. This recrystallized region of the ; silicon layer is substantially free of crystallographic defects.

Since the SPE process increases the crystallographic perfection of the silicon layer where the channel region is formed, the carrier mobility, the operating speeds and the drain currents of the devices are increased. However, this increased device performance is only realized when the device is not exposed to radiation. When the device is exposed to radiation, the performance is severely degraded because of high back-channel leakage currents. While this effect may be partially offset by an initial substrate annealing procedure and by doping the back-channel with the appropriate dopant, a technique is needed to produce a silicon-on-insulator composite with a higher degree of radiation hardness.

SUMMARY OF THE INVENTION

A silicon-on-insulator semiconductor device including a layer of silicon on an insulating substrate, a gate electrode and source and drain regions is disclosed. A first region having a high density of naturally occurring crystallographic defects is disposed in the layer of silicon adjacent the insulating substrate. The layer of silicon also contains a second region which is substantially free of crystallographic defects. A method of making this silicon-on-insulator semiconductor device is also provided.

BRIEF DESCRIPTION OF THE DRAWING

FIGS. 2a to 2g illustrate the method of the present invention for fabricating the silicon-on-insulator semiconductor device illustrated in FIG. 1.

DETAILED DESCRIPTION OF PREFERRED EMBODIMENT

Figure 1:
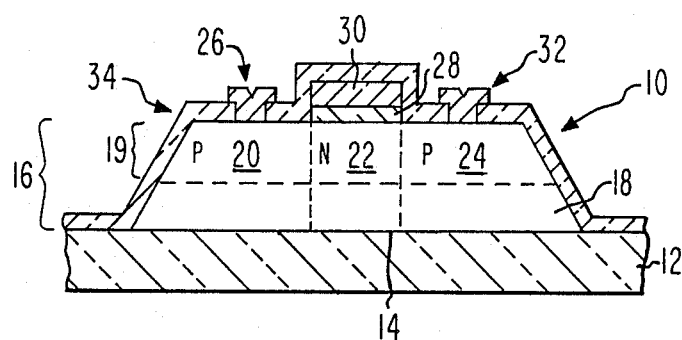
FIG. 1 is a sectional view illustrating the silicon-on-insulator semiconductor device of the present invention.

Referring to FIG. 1, the silicon-on-insulator semiconductor device, such as a silicon-on-sapphire (SOS) transistor, of the present invention is generally designated as 10. Although the device of the present invention will be described in reference to a silicon-on-sapphire transistor, other insulating materials, such as spinel or a layer of silicon dioxide disposed on a semiconductor substrate, may be substituted for the sapphire substrate 12. An island of single crystalline silicon 16 is formed on the sapphire substrate 12. The single crystalline silicon island 16 has a first region 18, adjacent the silicon/sapphire interface 14, which has a high density of naturally occurring crystallographic defects. Crystallographic defects in the first region 18 include grain boundaries, stacking faults, microtwins and dislocations. The silicon island 16 also contains a second region 19 which is substantially free of crystallographic defects.

The silicon-on-sapphire transistor 10 also includes a source region 20 and a drain region 24. For illustrative purposes only, the source and drain regions 20 and 24, respectively, are doped P-type. However, the source and drain regions 20 and 24, respectively, could also be doped N-type to form an N-channel transistor. The silicon island 16 also contains an N-doped channel region 22 which would be doped P-type in the case of an N-channel transistor. The device also includes source and drain contacts 26 and 32, respectively. A gate insulating layer 28, such as silicon dioxide, and a gate electrode 30, such as N-type polycrystalline silicon, are formed over the channel region 22. The entire structure is then covered with an insulating layer 34, such as silicon dioxide.

The process used to make the semiconductor device 10 shown in FIG. 1 is schematically illustrated in FIGS. 2a through 2g. As shown in FIG. 2a the method of the present invention begins with a sapphirre substrate 12 which has a polished upper surface. The sapphire substrate 12 is then annealed in hydrogen at a temperature of about 1200° C. for at least 20 minutes. This hydrogen annealing step is used to etch the sapphire substrate in preparation for the epitaxial growth of silicon. Alternatively, before the hydrogen annealing step, the sapphire substrate may be annealed in air at a temperature of about 1400° C. or higher for approximately 1 to 4 hours. The annealing step in air is used to clean and reconstruct the sapphire substrate after the wafer fabrication process.

As shown in FIG. 2b, a single crystalline silicon layer 16 is epitaxially grown on the sapphire substrate 12 by thermally decomposing silane in hydrogen. A low silicon growth rate, such as 0.1 to 1.0 μm/min. at a temperature of about 985° to 1015° C., is used. The slow growth rate promotes the formation of crystalline defects 36 in the region of the silicon layer 16 adjacent the silicon/sapphire interface 14. The density of the crystallographic defects in the silicon layer 16 is greater in the region adjacent interface 14 as compared to the regions near the exposed surface portions of the silicon layer 16. The single crystalline silicon layer 16 has a thickness of about 2,000 Å.

As shown in FIG. 2c, the single crystalline silicon layer 16 is implanted with $^{28}Si^+$ to form the amorphous region 40. The silicon ions in FIG. 2c are designated 38. The implant energy is controlled so that a first region 18 of the single crystalline silicon layer 16 adjacent the silicon/sapphire interface 14 is no implanted with the silicon ions 38. The first region 18 has a high density of naturally occurring crystallographic defects. This first region 18 also has a thickness of at least about 800 Å and, more particularly, at least about 1,000 Å. The silicon ions 38 are implanted at energies less than about 50 keV when the silicon layer 16 has a thickness of about 2,000 Å. A dose in the range of about $1\times10^{15} - 5\times10^{15}$ ions/cm$^2$ and, more particularly, about $2\times10^{15}$ ions/cm$^2$ is used to form the amorphous region 40. A thin region 42 of the silicon layer 16 adjacent the exposed surface remains crystalline. This thin region 42 and the first region 18 will serve as seed material for the subsequent recrystallization step.

After the silicon implant step, the entire structure is furnace annealed at a temperature in the range of about 550° to 1000° C. for about 15 min. to 4 hours depending on the annealing temperature. Alternatively, a heat pulse, electron beam or laser heating source can be used at a temperature of about 900° to 1100° C. for approximately 10–60 seconds. As shown in FIG. 2d, the amorphous region 40 is converted to a single crystalline region 44 which is substantially free of the naturally occurring crystallographic defects formed during the epitaxial silicon growth process. Thus, the silicon layer 16 has a first region 18 containing a high density of naturally occurring crystallographic defects and a second region 44 which is substantially free of crystallographic defects.

After the annealing step illustrated in FIG. 2d, the process may proceed in three alternative sequences. The structure produced in FIG. 2d may proceed directly to the device fabrication step illustrated in FIG. 2g. In the device fabrication step, the source, drain and channel implants are carried out using conventional MOS processing techniques. Then, the gate electrode, the gate insulating layer and the source and drain contacts are formed using conventional techniques. Finally, the entire device is covered with an insulating material using conventional chemical vapor deposition techniques.

Alternatively, the substrate fabricated in FIG. 2d may proceed to the step illustrated in FIG. 2e. In FIG. 2e, the double solid phase epitaxy (DSPE) process is carried out. In this process, a thin surface region of the silicon layer 16, including the region 42 which was used as seed material, is implanted with low energy silicon ions 46. This implantation step forms an amorphous region in the area which once served as the upper seed crystal. The amorphous region is then annealed using the same conditions described above in FIG. 2d. Thus, the top surface portion 42 of the silicon layer 16 shown in FIG. 2d is recrystallized to become a part of the second region 44 of the silicon layer 16 which is substantially free of crystallographic defects. After the step illustrated in FIG. 2e, the device is fabricated using the techniques previously described in the step illustrated by FIG. 2g.

The device fabricated in FIG. 2d may also be processed using a third alternative method illustrated in FIG. 2f. In FIG. 2f, the solid phase epitaxy and regrowth (SPEAR) process is carried out. In the SPEAR process, approximately 200 to 400 Å of the silicon layer 16 is removed using a wet chemical or vapor phase etching operation. This step removes the single crystalline silicon seed layer 42 shown in FIG. 2d. Then, an additional layer of silicon 48 is epitaxially grown on the originally deposited and etched silicon layer 16. The total thickness of the remaining silicon layer 16 and the newly grown silicon layer 48 is typically about 2500–5000 Å or higher. It is noted that the structure shown in FIG. 2f still contains the first region 18 having a high density of naturally occurring crystallographic defects. After the SPEAR process shown in FIG. 2f, the structure is then subjected to the conventional device fabrication steps shown by FIG. 2g.

Figures 3A, 3B:
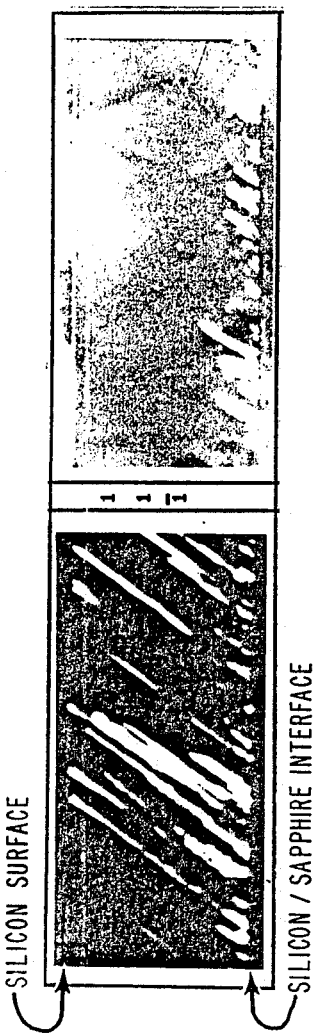
FIGS. 3a and 3b are transmission electron micrographs of silicon-on-sapphire composites.

FIGS. 3a and 3b are transmission electron micrographs illustrating the naturally occurring crystallographic defects, such as microtwins, grain boundaries, stacking faults and dislocations, present in the epitaxial silicon layers. However, the most visible defects in FIGS. 3a and 3b are microtwins. FIG. 3a is a cross section view of a corventional silicon-on-sapphire structure where the crystallographic defects propagate from the silicon/sapphire interface toward the silicon surface. FIG. 3b is a cross section view of a silicon-on-sapphire structure where an SPE process has been carried out to remove the crystallographic defects from the region of the silicon layer adjacent the exposed surface. However the implant energies used in this SPE process were controlled so that a silicon region having a high density of naturally occurring crystallographic defects remains adjacent the silicon/sapphire interface.

When the process of the present invention has been utilized to form a silicon/sapphire composite, it has been found that the surface of the silicon layer is smoother than the surface of the as grown silicon layer. A thin gate oxide having a high dielectric integrity can be grown on these smoother silicon surfaces. This is particularly important in radiation hard applications because the gate oxides in these devices must be as thin as possible so as to minimize the effects of radiation damage and the associated shifts in the device threshold voltage characteristics.

The high density defect region adjacent the silicon/sapphire interface of the present invention is used to make the device radiation hard. When the conventional SPE process is used to form an amorphous region all the way down to the silicon/sapphire interface, the post-irradiation device performance is severely degraded. This degradation is mainly in the form of back-channel leakage currents. It is believed that when all of the crystallographic defects are removed from the portion of the silicon layer adjacent the silicon/sapphire interface, the charge induced at the interface, due to radiation, has a much greater influence on charge carriers in the silicon film. Thus, a more conducting back-channel is formed between the source and drain regions of the transistor. This contributes to enhance back-channel leakage currents in both N and P channel transistors. If the silicon ions used in the SPE process pass through the silicon layer and damage the sapphire substrate, aluminum is released and a portion of the silicon film adjacent the silicon/sapphire interface is doped P-type. This doping phenomena is particularly troublesome in P-channel devices because the doped region serves as a back-channel between the source and drain.

In the present invention the high density region of crystallographic defects adjacent the silicon/sapphire interface substantially reduces the back-channel leakage currents in irradiated devices. When this device is then subjected to ionizing radiation, a charge still builds up at the silicon/sapphire interface. However, since the semiconducting properties of the silicon adjacent the interface are poor, carriers in the space charge region have relatively low mobility and the back-channel leakage currents are significantly diminished when compared to devices where there is high crystallographic perfection in the silicon film adjacent the silicon/sapphire interface.

MOS transistors produced by the SPE process of the present invention were compared to MOS transistors formed in the silicon regions which were not subjected to SPE processing. These results are tabulated in Table I. Epitaxial silicon layers having a thickness ($t_i$) of approximately 2,000 Å were deposited using conventional chemical vapor deposition techniques on prepared sapphire substrates. A portion of each layer was masked with a photoresist and silicon implantations were carried out at various implant energies and doses. Implantation only occurred in the portions of the silicon layers which were not covered by the photoresist. The masked areas served as control regions. After cleaning, the wafers were annealed to obtain solid phase epitaxy in the implanted regions. Additional silicon was then deposited over both the control and the implanted regions to obtain a final silicon film thickness ($t_f$) of about 5,000 Å. Then, both P-channel and N-channel MOS transistors were formed in the silicon which overlies both the implanted regions and the control regions.

As shown in the Table, the drive currents or k factor are higher in the devices fabricated using the SPE process of the present invention than in the devices fabricated in the silicon over the control regions. The Table also illustrates the device performance after a 1 MRAD (Si) gamma radiation dose. The table shows the back-channel leakage of the control device, $I_L(c)$, relative to the back-channel leakage, $I_L(spe)$, of devices produced using a variety of silicon implant energies and dosages.

TABLE

| Sample Identification Lot-Slot | Implant Conditions Energy | Dose | Silicon Film Thickness (Å) $t_i$ | $t_f$ | n-Channel $\frac{K_{spe}K_c}{K_c}$ Pre-Rad (%) | $I_L(c)/I_L(spe)$ Pre-Rad | Post-Rad | p-Channel $\frac{K_{spe}K_c}{K_c}$ Pre-Rad (%) | $(I_L(c)/I_L(spe))$ Pre-Rad | Post-Rad |
|---|---|---|---|---|---|---|---|---|---|---|
| 1-11 | 45 KeV | 2E15 | 2090 | 5060 | 12 | 1.0–1.9 | 1.0 | 29 | 1.0–5.4 | 1.0 |
| 2-11 | 45 KeV | 2E15 | 1960 | 4570 | 75 | 1.3–2.3 | | 71 | 1.0–0.4 | |
| 1-12 | 45 KeV | 4E15 | 1950 | 4980 | 21 | 1.3–2.5 | | 8.2 | 1.8–2.8 | |
| 2-12 | 45 KeV | 4E15 | 1950 | 4690 | 40 | 1.3–1.6 | | 25 | 0.6–4.0 | |
| 1-9 | 55 KeV | 2E15 | 2160 | 5440 | 37 | 1.0–1.6 | | 38 | 1.3–2.5 | |
| 2-9 | 55 KeV | 2E15 | 1880 | 4940 | 39 | 1.4–5.5 | | 44 | 1.0–1.6 | |
| 3-12 | 55 KeV | 2E15 | 2130 | 4890 | 15 | 1.3–3.2 | $4.4 \times 10^{-1}$ | 87 | 0.6–1.3 | $9.4 \times 10^{-1}$ |
| 3-13 | 55 KeV | 4E15 | 1920 | 4780 | 29 | 1.0–2.0 | | 38 | 1.6–3.0 | |
| 1-4 | 65 KeV | 1E15 | 2060 | 4790 | 13 | 1.3–1.5 | | 13 | 0.6–2.3 | |
| 2-4 | 65 KeV | 1E15 | 2050 | 4690 | 28 | 1.2–2.5 | | 38 | 1.0–0.5 | |
| 3-5 | 65 KeV | 1E15 | 1980 | 5200 | 29 | 1.6–3.5 | $5.1 \times 10^{-2}$ | 86 | 0.5–3.1 | $5.6 \times 10^{-2}$ |
| 1-5 | 65 KeV | 2E15 | 1890 | 4870 | 21 | 1.0–1.8 | | 33 | 1.5–3.8 | |
| 2-5 | 65 KeV | 2E15 | 1870 | 4630 | 16 | 1.1–3.8 | | 37 | 1.0–0.3 | |
| 1-6 | 65 KeV | 4E15 | 2200 | 5250 | 25 | 2.0 | | 10 | 2.2–6.4 | |
| 1-7 | 65 KeV | 4E15 | 1960 | 4510 | 26 | 1.2–1.9 | | 28 | 1.3–0.4 | |
| 2-7 | 65 KeV | 4E15 | 1940 | 4520 | 34 | 1.6–2.4 | | 35 | 1.4–2.9 | |
| 3-9 | 65 KeV | 4E15 | 2100 | 4980 | 43 | 1.0–1.7 | | 44 | 1.1–1.9 | |
| 2-8 | 65 KeV | 8E15 | 2090 | 5080 | 41 | 0.8–2.6 | | 28 | 1.0–5.0 | |
| 3-10 | 65 KeV | 8E15 | 2030 | 4980 | 25 | 1.0–5.6 | | 38 | 1.7–4.0 | |
| 3-11 | 65 KeV | 8E15 | 2040 | 5230 | 39 | 1.6–3.1 | $2.7 \times 10^{-2}$ | 38 | 1.6–3.6 | $3.65 \times 10^{-2}$ |
| 1-2 | 75 KeV | 2E15 | 1960 | 5030 | 28 | 1.6–2.5 | | 40 | 1.4–7.1 | |
| 1-3 | 75 KeV | 4E15 | 1910 | 4940 | 38 | 2.0–3.2 | $1.6 \times 10^{-4}$ | 38 | 1.6–6.4 | $1.4 \times 10^{-2}$ |
| 3-3 | 75 KeV | 4E15 | 1940 | 4840 | 30 | 1.6–3.2 | $1.15 \times 10^{-3}$ | 51 | 1.3–3.1 | $2.3 \times 10^{-2}$ |
| 1-1 | 110 KeV | 1E15 | 2020 | 4700 | 4 | 1.0–2.5 | $1.65 \times 10^{-3}$ | 13 | .003–.06 | $2.3 \times 10^{-1}$ |
| 2-1 | 110 KeV | 1E15 | 2020 | 4880 | 0 | 0.8–4.0 | $4.5 \times 10^{-4}$ | 17 | .0002 | $3.7 \times 10^{-2}$ |

Figure 4:
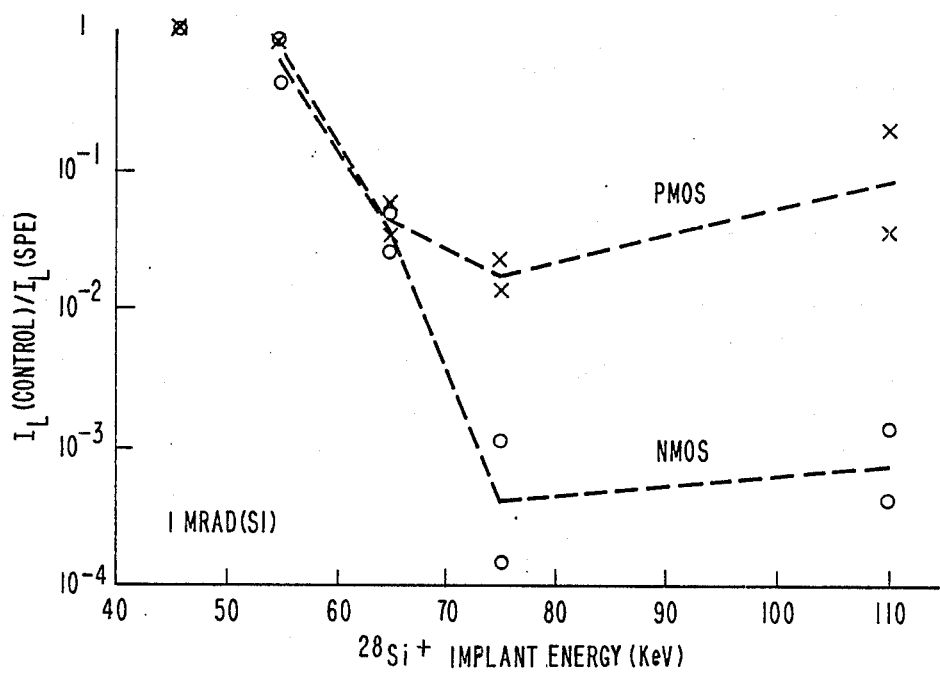
FIG. 4 is a graph of the radiation induced leakage currents in silicon-on-insulator semiconductor devices versus the implant energies used to make the devices.

The increased radiation hardness of the devices produced by the method of the present invention can be more easily seen in FIG. 4. As shown in FIG. 4, when the silicon implant energy is less than about 50 keV, the back-channel leakage in a device fabricated with the solid phase epitaxy process of the present invention is the same as the back-channel leakage in the control device which was not subjected to SPE processing. When energies greater than about 50 keV are utilized, the back-channel leakage in a device produced by the SPE process is greater than the leakage in the control device. It has been found that when an implant energy of about 50 keV or less is utilized in a silicon film having a thickness of about 2000 Å, a high density defect region having a thickness of approximately 800–1,000 Å remains adjacent the silicon/sapphire interface. The high density defect region adjacent the sapphire substrate increases the radiation hardness of devices produced by the SPE process of the present invention. When implant energies greater than 50 keV are utilized in a silicon film having an original thickness of 2,000 Å, the semiconducting properties of the silicon are improved to a greater depth within the layer and the back-channel leakage currents due to the radiation induced charge at the silicon/sapphire interface increase. Also, when the implant energies of the present invention are utilized, the silicon ions do not pass through the 2000 Å silicon layer and damage the sapphire substrate. Thus, there is no aluminum doping of the back-channel in the present invention.

If the initial silicon film has a thickness different than 2,000 Å, the implant energy must be adjusted so that the unimplanted region having a high density of naturally occurring crystallographic defects has a thickness of at least about 800 Å, and more particularly, at least about 1,000 Å. If the epitaxially grown silicon layer has a thickness T, the implant energy levels are selected so that the silicon ions are implanted to a depth which is less than or equal to about T-800 Å, and more particularly, about T-1000 Å.

The devices produced by the present invention have higher drive currents than conventional devices because good quality silicon is adjacent the silicon surface where the channel region is formed. However, the present invention overcomes the post-irradiation device performance problems normally associated with conventional SPE processes by forming a region having a high density of naturally occurring crystallographic defects adjacent the silicon/insulating substrate interface.

We claim:

1. In a method of making a silicon-on-insulator semiconductor device including a layer of silicon on an insulating substrate, a gate electrode and source and drain regions, the improvement comprising:
    forming a first region in said layer of silicon adjacent said insulating substrate which has a high density of naturally occurring crystallographic defects; and
    forming a second region in said layer of silicon which is substantially free of crystallographic defects.

2. A method of making a silicon-on-insulator semiconductor device in accordance with claim 1 wherein said first region has a thickness sufficient to make said device radiation hard.

3. A method of making a silicon-on-insulator semiconductor device in accordance with claim 1 wherein said insulating substrate is sapphire.

4. A method of making a silicon-on-insulator semiconductor device in accordance with claim 1 wherein said first region has a thickness of at least about 800 Å.

5. A method of making a silicon-on-insulator semiconductor device in accordance with claim 1 wherein said first region has a thickness of at least about 1,000 Å.

6. A method of making a silicon-on-insulator semiconductor device comprising the steps of
    forming a layer of monocrystalline silicon on an insulating substrate, said monocrystalline silicon layer having at least a region adjacent said substrate which has a high density of naturally occurring crystallographic defects;
    forming an amorphous region in said silicon layer above said high density region of naturally occurring crystallographic defects;
    annealing said silicon layer to recrystallize said amorphous region to form a monocrystalline region which is substantially free of crystallographic defects.

7. A method of making a silicon-on-insulator semiconductor device according to claim 6 wherein said insulating substrate is sapphire.

8. A method of making a silicon-on-insulator semiconductor device according to claim 7 wherein said layer of monocrystalline silicon is formed by epitaxially growing silicon at a rate which produces a large number of naturally occurring crystallographic defects.

9. A method of making a silicon-on-insulator semiconductor device according to claim 8 wherein said rate is about 0.1–1.0 μm/min.

10. A method of making a silicon-on-insulator semiconductor device according to claim 6 wherein said amorphous region is formed by ion implanting said silicon layer with silicon ions.

11. A method of making a silicon-on-insulator semiconductor device according to claim 10 wherein silicon ions are implanted into said silicon layer to a depth which is less than or equal to about T-800 Å, where T is the thickness of said layer of monocrystalline silicon 12. A method of making a silicon-on-insulator semiconductor device according to claim 10 wherein said silicon ions are implanted at a dosaqe of about $1 \times 10^{15} - 5 \times 10^{15}$ ions/cm$^2$.

13. A method of making a silicon-on-insulator semiconductor device according to claim 6 further comprising the step of:
    annealing said sapphire substrate before the step of forming said layer of monocrystalline silicon.

14. A method of making a silicon-on-insulator semiconductor device according to claim 6 wherein said region adjacent said insulating substrate having a high density of naturally occurring crystallographic defects has a thickness sufficient to make said device radiation hard.

* * * * *